(12) United States Patent
Kim et al.

(10) Patent No.: US 9,690,190 B2
(45) Date of Patent: Jun. 27, 2017

(54) PELLICLES AND METHODS OF MANUFACTURING THE SAME

(71) Applicant: SAMSUNG ELECTRONICS CO., LTD., Suwon-si, Gyeonggi-do (KR)

(72) Inventors: Mun-Ja Kim, Suwon-si (KR);
Tae-Sung Kim, Suwon-si (KR);
Ji-Beom Yoo, Seoul (KR);
Byung-Gook Kim, Seoul (KR);
Soo-Young Kim, Suwon-si (KR);
Dong-Wook Shin, Changwon-si (KR);
Jae-Hyuck Choi, Seoul (KR)

(73) Assignees: SAMSUNG ELECTRONICS CO., LTD., Suwon-Si, Gyeonggi-Do (KR);
SUNGKYUNKWAN UNIVERSITY'S RESEARCH & BUSINESS FOUNDATION, Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/969,645

(22) Filed: Dec. 15, 2015

(65) Prior Publication Data

US 2016/0201201 A1 Jul. 14, 2016

(30) Foreign Application Priority Data

Jan. 9, 2015 (KR) ........................ 10-2015-0003112

(51) Int. Cl.
| G03F 1/62 | (2012.01) |
| C01B 31/04 | (2006.01) |
| C23C 16/01 | (2006.01) |
| C23C 16/26 | (2006.01) |
| C23F 1/14 | (2006.01) |
| C23C 16/56 | (2006.01) |
| C23F 1/00 | (2006.01) |

(Continued)

(52) U.S. Cl.
CPC ................ *G03F 1/62* (2013.01); *C01B 31/04* (2013.01); *C01B 31/0438* (2013.01); *C01B 31/0484* (2013.01); *C23C 16/01* (2013.01); *C23C 16/26* (2013.01); *C23C 16/56* (2013.01); *C23F 1/00* (2013.01); *C23F 1/14* (2013.01); *G03F 1/64* (2013.01); *C23F 1/02* (2013.01)

(58) Field of Classification Search
None
See application file for complete search history.

(56) References Cited

U.S. PATENT DOCUMENTS

| 6,509,124 B1 | 1/2003 | Noguchi et al. |
| 7,544,523 B2 | 6/2009 | Schwind et al. |

(Continued)

FOREIGN PATENT DOCUMENTS

| JP | 2013-008680 A | 1/2013 |
| KR | 10-0797775 B1 | 1/2008 |

(Continued)

*Primary Examiner* — Jiong-Ping Lu
(74) *Attorney, Agent, or Firm* — Lee & Morse P.C.

(57) ABSTRACT

A method of manufacturing a pellicle includes forming a membrane on a first surface of a substrate from a chemical reaction in which the substrate serves as a catalyst, forming a protective pattern on a second surface of the substrate, immersing the substrate in an etchant solution, such that a portion of the substrate exposed through the protective pattern is removed to form a frame, and replacing the etchant solution with a solvent.

8 Claims, 8 Drawing Sheets

(51) Int. Cl.
  *G03F 1/64*     (2012.01)
  *C23F 1/02*     (2006.01)

(56) References Cited

U.S. PATENT DOCUMENTS

| | | |
|---|---|---|
| 2009/0131245 A1 | 5/2009 | Esconjauregui et al. |
| 2011/0200787 A1* | 8/2011 | Regan .................... H01J 37/20 |
| | | 428/138 |
| 2011/0210415 A1 | 9/2011 | Altavilla et al. |
| 2012/0101300 A1 | 4/2012 | Tao et al. |
| 2012/0107594 A1 | 5/2012 | Kang et al. |
| 2012/0126458 A1 | 5/2012 | King et al. |
| 2012/0248460 A1 | 10/2012 | Abraham et al. |
| 2013/0043486 A1 | 2/2013 | Abraham et al. |
| 2013/0115439 A1 | 5/2013 | Wang et al. |
| 2013/0230722 A1 | 9/2013 | Fujii et al. |
| 2013/0319841 A1 | 12/2013 | Chao et al. |
| 2014/0209456 A1 | 7/2014 | Kim et al. |

FOREIGN PATENT DOCUMENTS

| | | |
|---|---|---|
| KR | 10-2012-0023471 A | 3/2012 |
| KR | 10-2013-0110870 A | 10/2013 |

\* cited by examiner

PELLICLES AND METHODS OF MANUFACTURING THE SAME

CROSS-REFERENCE TO RELATED APPLICATION

Korean Patent Application No. 10-2015-0003112, filed on Jan. 9, 2015, in the Korean Intellectual Property Office, and entitled: "Pellicles and Methods of Manufacturing the Same," is incorporated by reference herein in its entirety.

BACKGROUND

1. Field

Example embodiments relate to pellicles and methods of manufacturing the same. More particularly, example embodiments relate to pellicles for a photomask and methods of manufacturing the same.

2. Description of the Related Art

While performing an exposure process, molecules in the atmosphere or various contaminants may be attached to a surface of a photomask to result in damages of optical patterns formed on the photomask. Thus, a cleaning process may be performed on the photomask at predetermined intervals during the exposure process. Further, a pellicle including a transparent pellicle membrane may be placed on the surface of the photomask to avoid contamination of the photomask.

SUMMARY

According to example embodiments, there is provided a method of manufacturing including forming a membrane on a first surface of a substrate from a chemical reaction in which the substrate serves as a catalyst, forming a protective pattern on a second surface of the substrate, immersing the substrate in an etchant solution, such that a portion of the substrate exposed through the protective pattern is removed to form a frame, and replacing the etchant solution with a solvent.

In example embodiments, the substrate may include iron (Fe), nickel (Ni), cobalt (Co), copper (Cu), silicon (Si) and a combination thereof.

In example embodiments, the membrane may include graphite, carbon nano tube (CNT) and/or graphene.

In example embodiments, in replacing the etchant solution with the solvent, the etchant solution may be replaced with a first solvent. The first solvent may be removed.

In example embodiments, in replacing the etchant solution with the solvent, the etchant solution may be replaced with a first solvent. The first solvent may be replaced with a second solvent. The second solvent may be removed.

In example embodiments, the second solvent may have a surface energy lower than that of the first solvent.

In example embodiments, the first solvent may include water, and the second solvent may include alcohol.

In example embodiments, a dropping pipette may be used in replacing the first solvent with the second solvent.

In example embodiments, the second solvent may be removed by evaporation.

In example embodiments, the protective pattern may be formed on a peripheral portion of the substrate, and the frame may support a peripheral portion of the membrane.

In example embodiments, the etchant solution may have a relatively high etching rate with respect to the substrate, and may have a relatively low etching rate with respect to the protective layer pattern and the membrane.

In example embodiments, the protective layer pattern may include a photoresist material, a polymer material or an adhesive material.

In example embodiments, in replacing the etchant solution with the solvent, the protective layer pattern may be removed.

In example embodiments, in immersing the substrate in the etchant solution, the substrate may be fully immersed in the etchant solution.

In example embodiments, in immersing the substrate in the etchant solution, the substrate may be floated on the etchant solution.

According to example embodiments, there is provided a pellicle. The pellicle includes a membrane including graphite, carbon nano tube or graphene, and a frame supporting a lower portion of the membrane. The frame includes a catalytic material for a formation of the membrane.

In example embodiments, the frame may include iron (Fe), nickel (Ni), cobalt (Co), copper (Cu), silicon (Si) or a combination thereof.

In example embodiments, the frame may support a peripheral portion of the membrane.

In example embodiments, the membrane may have a thickness ranging from about 0.1 nm to about 100 nm.

In example embodiments, the membrane may have a width ranging from about 0.1 cm to about 10 cm.

According to example embodiments, there is provided a method of manufacturing a pellicle, including forming a membrane on a first surface of a substrate, forming a protective pattern on a second surface of the substrate, such that the protective pattern only partially covers the second surface of the substrate, immersing the substrate in an etchant solution, such that a portion of the substrate exposed through the protective pattern is removed to form a frame, and replacing the etchant solution with a solvent to remove the protective pattern, such that the membrane with the frame define the pellicle.

The first and second surfaces of the substrate may be opposite to each other, and immersing the substrate may include immersing the substrate in its entirety in the etchant solution, such that the membrane and the protective pattern on the first and second surfaces of the substrate are at least partially immersed in the etchant solution.

Removal of portions of the substrate and of the protective patterns may be performed while the substrate is immersed in liquid.

The membrane may be stationary during replacement of the etchant solution with the solvent.

During immersing of the substrate and replacing of the etchant, removal of portions of the substrate and of the protective patterns may be performed in a liquid environment.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers or elements may also be present. In addition, it will also be understood that when a layer or element is referred to as being "between" two layers or elements, it can be the only layer or elements between the two layers or e elements, or one or more intervening layers or elements may also be present. Further, it will be understood that when an element or layer is referred to as being "connected to" or "coupled to" another element or layer, it can be directly connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. Like reference numerals refer to like elements throughout.

As used herein, the term "and/or" includes any and all combinations of one or more of the associated listed items. It will also be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1, 2A, 2B, 3A, 3B, 4, 5, 6A, and 6B are cross-sectional views and top plan views illustrating stages in a method of manufacturing a pellicle in accordance with example embodiments.

Figure 1:
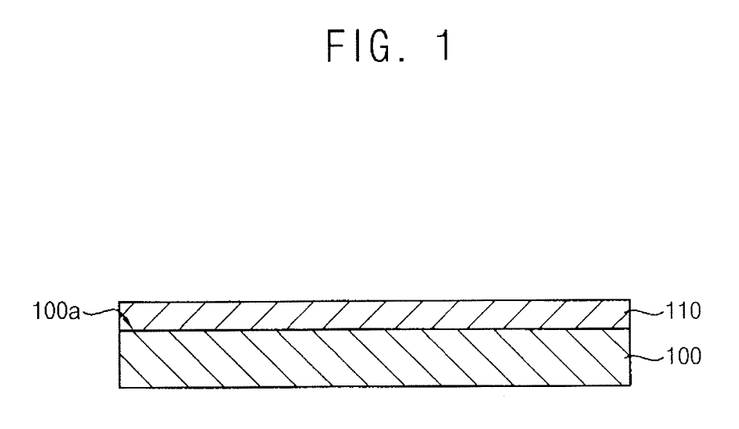
FIGS. 1, 2A, 2B, 3A, 3B, 4, 5, 6A, and 6B illustrate cross-sectional views and top plan views of stages in a method of manufacturing a pellicle in accordance with example embodiments.

Referring to FIG. 1, a membrane 110 may be formed on a first surface 100a of a substrate 100.

The substrate 100 may include, e.g., silver (Ag), iron (Fe), nickel (Ni), cobalt (Co), copper (Cu), silicon (Si), or a combination thereof. The substrate 100 may have a single-layered structure as illustrated in FIG. 1, or a multi-layered structure. For example, the substrate 100 may have a thickness ranging from about 0.1 cm to about 10 cm.

The membrane 110 may include carbon allotrope, e.g., carbon nano tube (CNT) or graphene. For example, the membrane 110 may include single-layered or multi-layered graphene, graphite, graphene oxide, graphite oxide, etc.

In example embodiments, the membrane 110 may have a single-layered structure including the above-mentioned carbon allotrope-based material. In one embodiment, the membrane 100 may have a multi-layered structure further including a layer of, e.g., silicon, molybdenum, zirconium, ruthenium or a combination thereof. The membrane 110 may have a thickness ranging from about 0.1 nm to about 100 nm.

The membrane 110 may be formed by, e.g., an exfoliation method, a sublimation method (e.g., a method of forming graphene on a SiC substrate) or a chemical vapor deposition (CVD) process. The CVD process may include, e.g., a rapid thermal CVD (RTCVD) process, an inductively coupled plasma CVD (ICP-CVD) process, a low pressure CVD (LPCVD) process, an atmospheric pressure CVD (APCVD) process, a metal organic CVD (MOCVD) process, a plasma enhanced CVD (PECVD) process, etc. In example embodiments, the substrate 100 may serve as a catalyst for the formation of the membrane 110, e.g., the membrane 110 may be formed in a chemical reaction in which the substrate 100 is a catalyst.

Figure 2A:
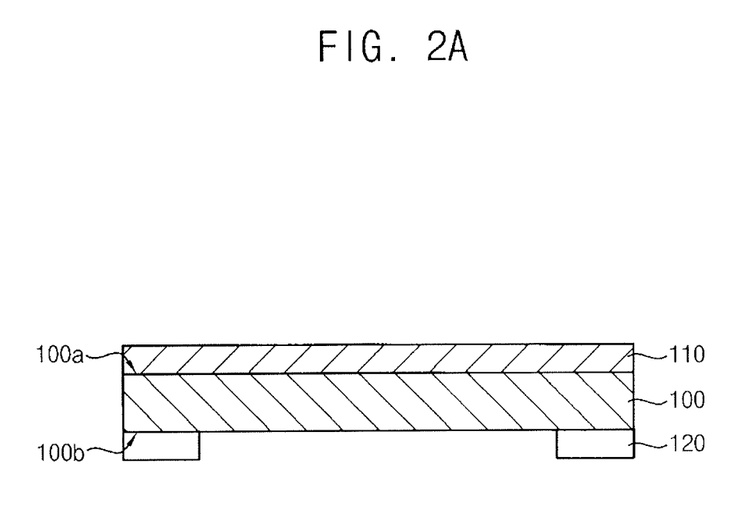
Figure 2B:
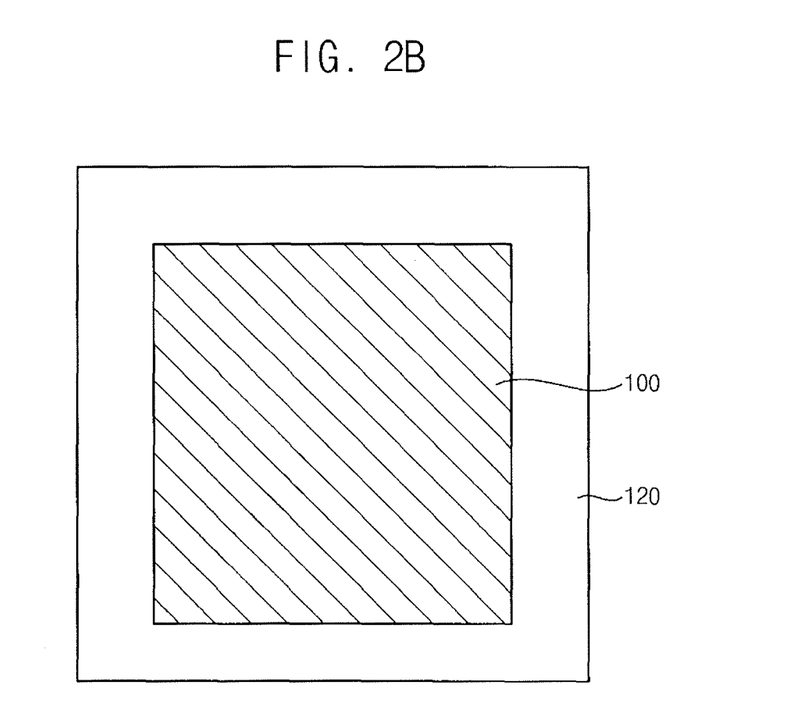

Referring to FIGS. 2A and 2B, a protective layer pattern 120 may be formed on, e.g. a second surface 100b of the substrate 100 that faces the first surface 100a.

The protective layer pattern 120 may, e.g., only, partially cover the second surface 100b of the substrate 100. The protective layer pattern 120 may include, e.g., a photoresist material, a polymer material, or an adhesive material. For example, the protective layer pattern 120 may include poly(methyl)acrylate, polystyrene, polydimethylsiloxane (PDMS), a polyurethane-based film, a water-based adhesive, a water-soluble adhesive (e.g., polyvinyl alcohol), a vinyl acetate emulsion adhesive, a hot melt adhesive, a light (e.g., UV, visible, electron beam, UV/EB)-curable adhesive, a light-softening tape, polybenzimidazole (PBI), polyimide, silicone/imide, bismaleimide (BMI), a modified epoxy resin, a polyvinyl alcohol tape/thin layer, a conventional adhesive tape, etc.

In example embodiments, the protective layer pattern 120 may be formed on a peripheral portion of the substrate 100. Thus, a central portion of, e.g., the second surface 100b of, the substrate 100 may be exposed through the protective layer pattern 120.

For example, as illustrated in FIG. 2B, the protective layer pattern 120 may entirely cover the peripheral portion of the substrate 100, e.g., the protective layer pattern 120 may extend along an entire perimeter of the substrate 100. In another example, the protective layer pattern 120 may be formed on both lateral portions of the substrate 100.

Figure 3A:
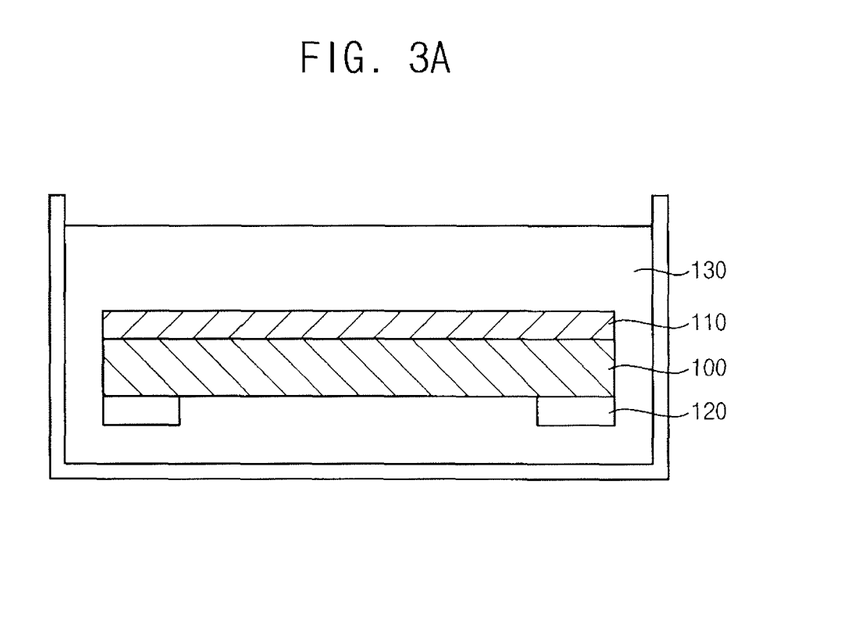
Figure 3B:
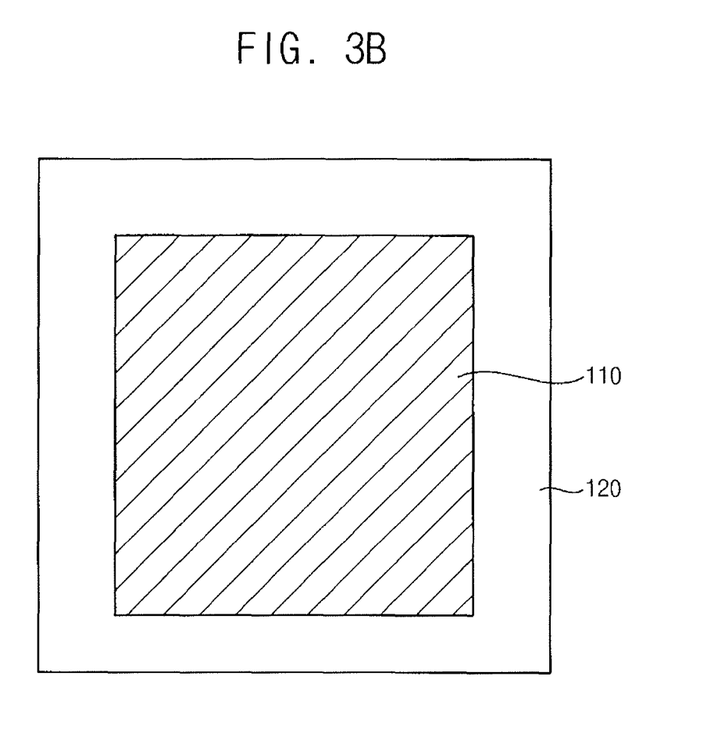

Referring to FIGS. 3A and 3B, the substrate 100 may be immersed in an etchant solution 130 so that the substrate 100 may be partially removed.

The etchant solution 130 may have an etching selectivity for the substrate 100 relative to the protective layer pattern 120. For example, the etchant solution 130 may have a relatively high etching rate for the substrate 100, and may have a relatively low etching rate for the protective layer pattern 120 and the membrane 110.

Figure 4:
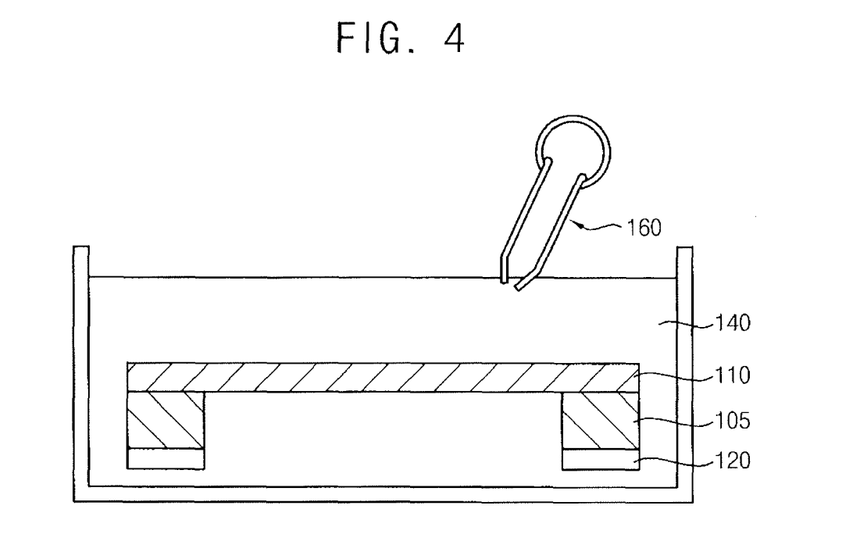

Accordingly, a portion of the substrate 100 exposed through the protective layer pattern 120 may be removed, and a portion of the substrate 100 covered by the protective layer pattern 120 may remain to form a frame 105 (FIG. 4). The frame 105 may have a planar shape substantially corresponding to that of the protective layer pattern 120. For example, the frame 105 may be formed along a peripheral portion of the membrane 110. The frame 105 may include, e.g., Ag, Fe, Ni, Co, Cu, Si, or a combination thereof, and may have an improved mechanical strength.

According to example embodiments, a process for the formation of the frame 105 may be performed, e.g., entirely, in fluid, e.g., entirely immersed in the etchant solution 130. Thus, damage to the membrane 110, e.g., caused when the membrane 110 is moved, transferred, or attached to the frame 105, may be avoided or substantially minimized.

Referring to FIG. 4, the etchant solution 130 may be replaced with a first solvent 140.

The first solvent 140 may include water. In example embodiments, removal of the etchant solution 130 and introduction of the first solvent 140 may occur concurrently. For example, a dropping pipette 160 may be utilized for a replacement between the etchant solution 130 and the first solvent 140. In another example, the first solvent 140 may be provided after the removal of the etchant solution 130.

The frame 105 may not be damaged or etched because the etchant solution 130 is changed into the first solvent 140. An etchant residue may be also removed while providing the first solvent 140, and the membrane 110, the frame 105 and the protective layer pattern 120 may be cleaned.

In example embodiments, the membrane 110 may be supported by the frame 105. The membrane 110 may be present in, e.g., covered with, fluid while replacing the etchant solution 130 with the first solvent 140, e.g., the membrane 110 may remain stationary in a container accommodating the etchant solution 130 and the first solvent 140. Thus, the membrane 110 may not be damaged.

Figure 5:
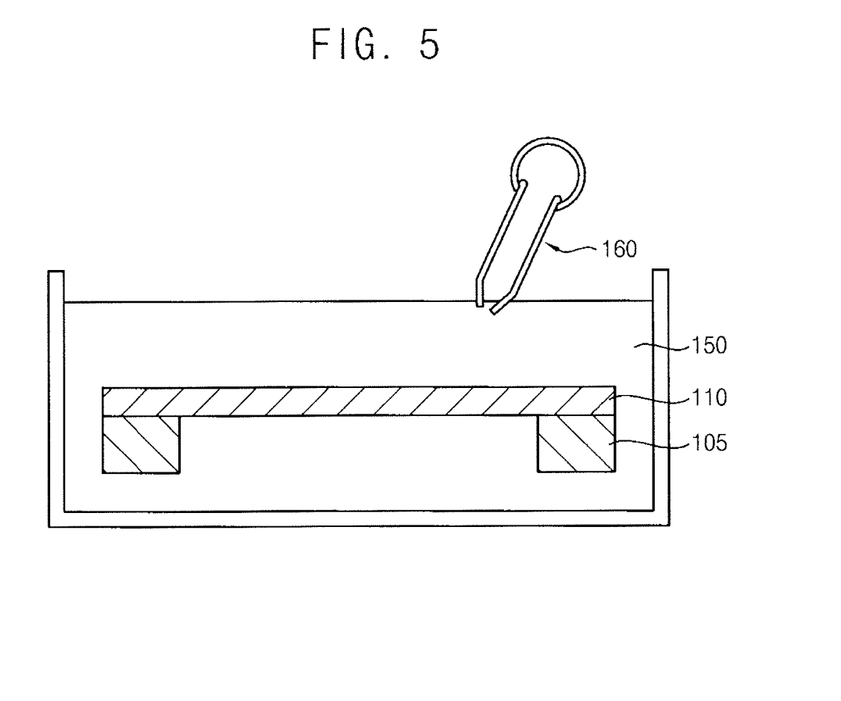

Referring to FIG. 5, the first solvent 140 may be replaced with a second solvent 150.

The second solvent 150 may have an etching selectivity between the frame 105 and the protective layer pattern 120. In example embodiments, the second solvent 150 may have a relatively low etching rate with respect to the frame 105, and may have a relatively high etching rate with respect to the protective layer pattern 120. Accordingly, the protective layer pattern 120 may be selectively removed by the second solvent 150.

The second solvent 150 may have a surface energy lower than that of the first solvent 140. The second solvent 150 may have a relatively low surface energy so that a force imposed on the membrane 110 by the second solvent 150 may be reduced. Thus, the second solvent 150 may be easily removed, and damage to the membrane 110 may be prevented or substantially minimized.

In example embodiments, the second solvent 150 may include alcohol. For example, the second solvent 150 may include isopropyl alcohol (IPA), propanol, butanol, pentanol, hexanol, or a combination thereof.

In example embodiments, removal of the first solvent 140 and introduction of the second solvent 150 may occur concurrently. For example, the dropping pipette 160 may be utilized for replacement of the first solvent 140 and the second solvent 150. In another example, the second solvent 150 may be provided after the removal of the first solvent 140.

Figure 6A:
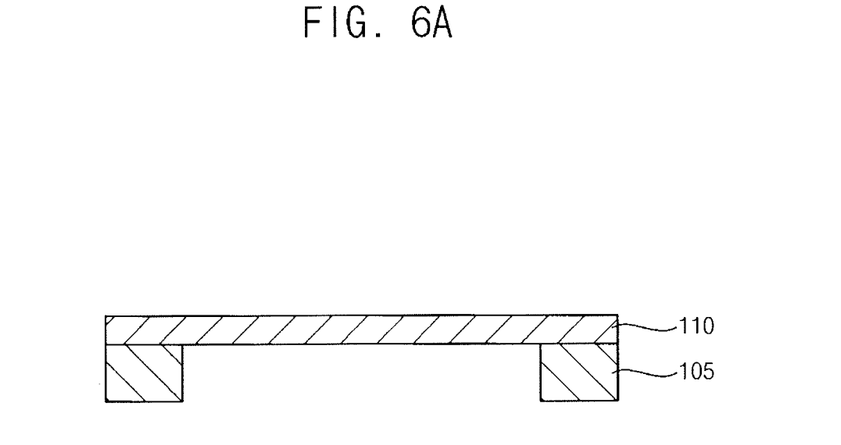
Figure 6B:
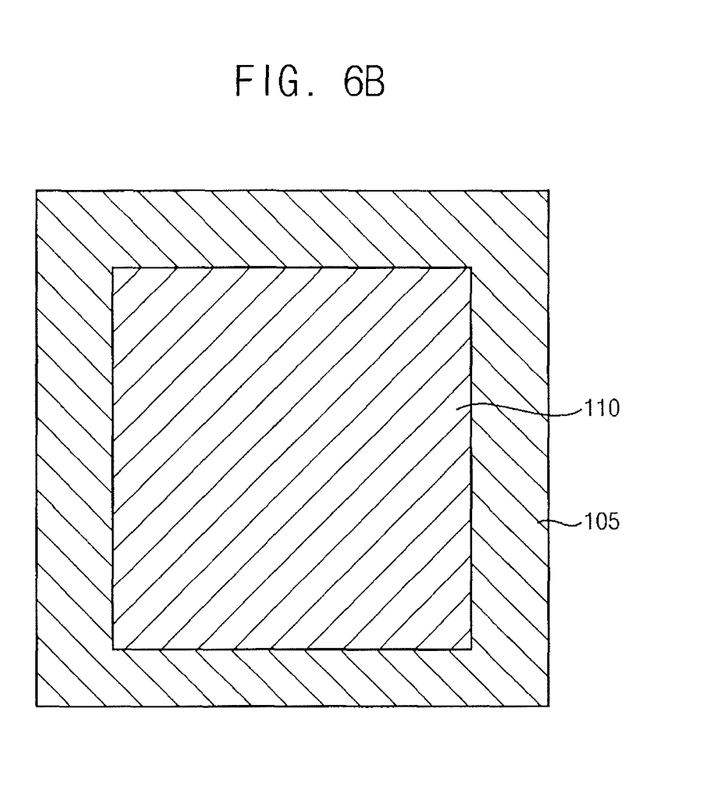

Referring to FIGS. 6A and 6B, the second solvent 150 may be removed to obtain a pellicle including the membrane 110 and the frame 105.

In example embodiments, the second solvent 150 may be removed through evaporation. However, other methods may be implemented for the removal of the second solvent 150 without damaging the membrane 110.

As mentioned above, the second solvent 150 may have a relatively low surface energy so that the membrane 110 may not be damaged while removing the second solvent 150. Thus, the pellicle may be formed without damaging the membrane 110.

The method illustrated with reference to FIGS. 1 to 6B may include replacing the etchant solution 130 with the first solvent 140, followed by replacing the first solvent 140 with the second solvent 150. However, the first solvent 140 may not be involved, and the etchant solution 130 may be replaced with the second solvent 150.

Figure 7:
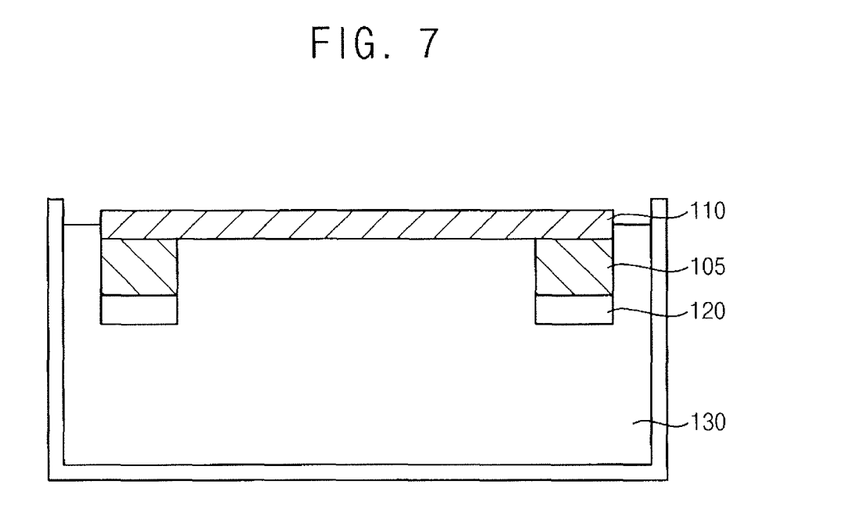
FIG. 7 illustrates a cross-sectional view of a stage in a method of manufacturing a pellicle in accordance with example embodiments.

FIG. 7 is a cross-sectional view illustrating a method of manufacturing a pellicle in accordance with example embodiments. The method illustrated in FIG. 7 may be substantially the same as or similar to the method illustrated in FIGS. 1 to 6B, except that the substrate 100 (see FIGS. 2A and 2B) may be floated on the etchant solution 130.

Referring to FIG. 7, the substrate 100 may be floated on the etchant solution 130. In this case, a lower portion of the substrate 100 adjacent to the protective layer pattern 120 may be in direct contact with the etchant solution 130. Accordingly, a portion of the substrate 100 exposed through the protective layer pattern 120 may be removed by the etchant solution 130 such that the frame 105 may be formed.

In an embodiment, the pellicle may be used in a photolithography process utilizing an incident beam of less than about 190 nm. In detail, the pellicle may be used in a photolithography process for forming a pattern that may have a width of less than about 30 nm. For example, the width of the pattern may be less than about 30 nm, less than about 22 nm, less than about 16 nm, from about 1 nm to about 30 nm, from about 1 nm to about 25 nm, from about 1 nm to about 22 nm, from about 1 nm to about 16 nm, from about 1 nm to about 10 nm, from about 1 nm to about 5 nm, from about 5 nm to about 30 nm, from about 5 nm to about 25 nm, from about 5 nm to about 22 nm, from about 5 nm to about 16 nm, from about 5 nm to about 10 nm, from about 10 nm to about 30 nm, from about 10 nm to about 22 nm, from about 10 nm to about 16 nm, from about 16 nm to about 30 nm, from about 16 nm to about 25 nm, from about 16 urn to about 22 nm, from about 22 nm to about 30 nm, from about 22 urn to about 25 nm, or from about 25 nm to about 30 nm.

Figure 8:
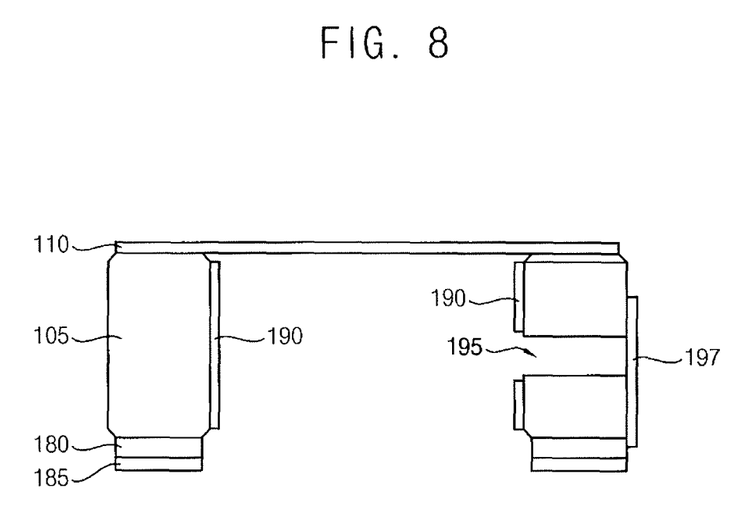
FIG. 8 illustrates a cross-sectional view of a pellicle in accordance with example embodiments.

FIG. 8 is a cross-sectional view illustrating a pellicle in accordance with example embodiments.

Referring to FIG. 8, a pellicle may include the membrane 110 and the frame 105. In example embodiments, the pellicle may further include a lower adhesive 180, a liner 185, an inner adhesive 190, a vent hole 195, and a gas outlet filter 197. The membrane 110 and the frame 105 may be prepared by the methods illustrated with reference to FIGS. 1 to 7.

The lower adhesive 180 may be formed on a lower surface of the frame 105. In example embodiments, the lower adhesive 180 may have a film shape, and the pellicle may be fixed to a surface of a photomask by the lower adhesive 180.

The liner 185 may be formed on a lower surface of the lower adhesive 180. The liner 185 may serve as a protective film for the lower adhesive 180. When the pellicle is attached to the photomask, the liner 185 may be removed from the pellicle.

The inner adhesive 190 may be formed on an inner sidewall of the frame 105. The inner adhesive 190 may be provided as a film shape or a paste. Particles or contaminants from an outside of the pellicle may be collected or filtered by the inner adhesive 190.

The vent hole 195 may extend through the inner sidewall and an outer sidewall of the frame 105. As such, damage to the membrane 110 caused by a pressure difference between an outside and an inside of the pellicle may be prevented by the vent hole 195. Further, flexibility of the frame 105 may be improved and pressure imposed on the frame 105 from the photomask may be dispersed by the vent hole 195.

The gas outlet filter 197 may be disposed on the outer sidewall of the frame 105, and may cover the vent hole 195. The gas outlet filter 197 may prevent the particles and the contaminants from being diffused into the pellicle.

In some embodiments, an adhesive for attaching the membrane 110 to the frame 105 may be further provided.

Figure 9:
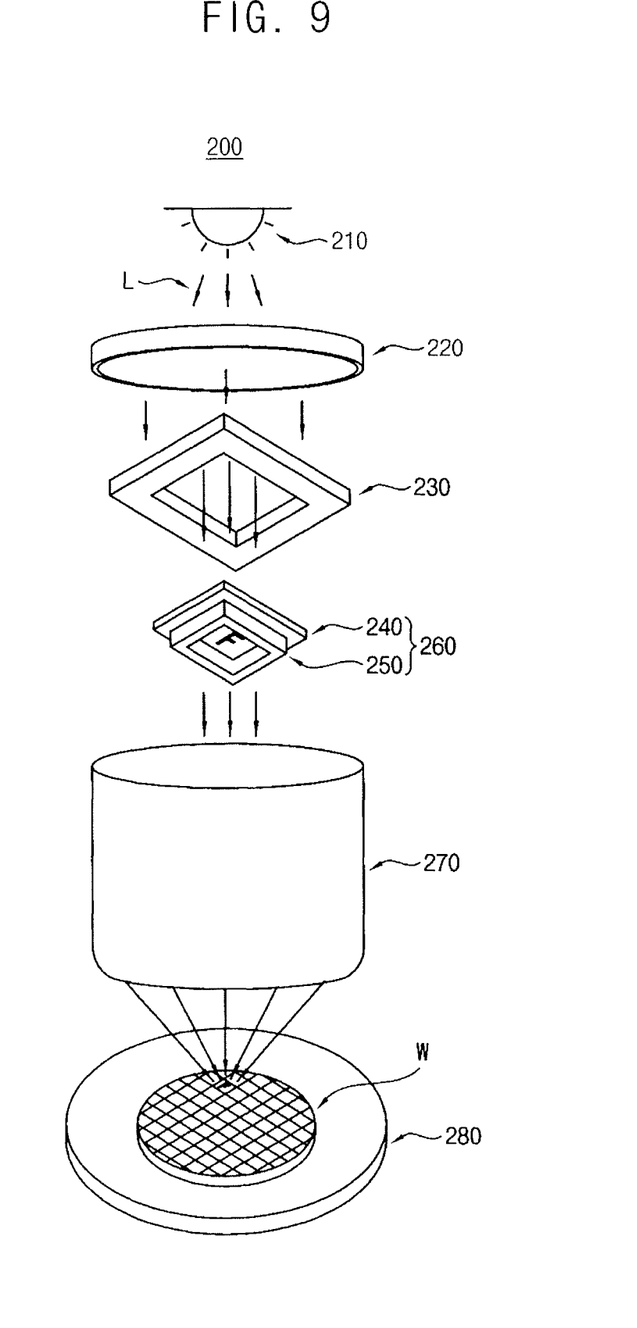
FIG. 9 illustrates a schematic view of an exposure process for formation of a pattern on a wafer using a pellicle in accordance with example embodiments.
Figure 10:
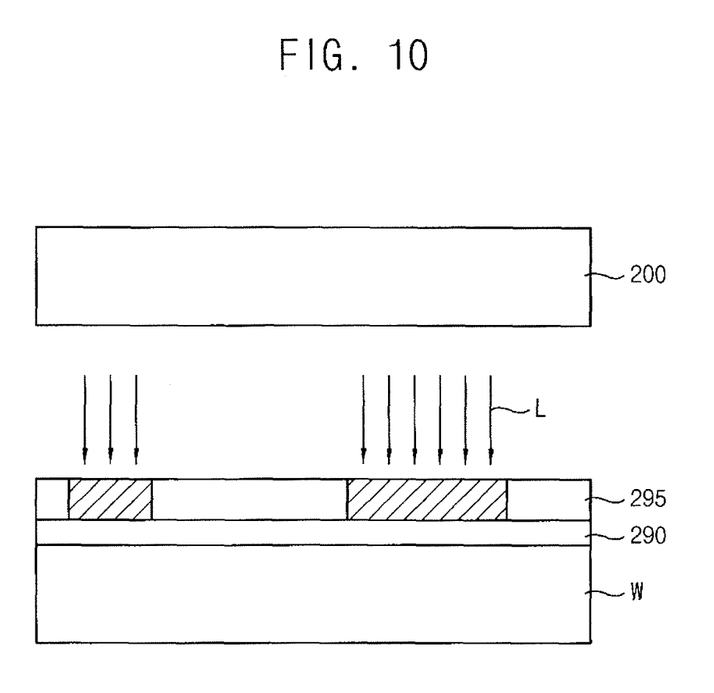
FIG. 10 illustrates a cross-sectional view of an exposure process for formation of a pattern using a pellicle in accordance with example embodiments.

FIG. 9 is a schematic view illustrating an exposure process for a formation of a pattern on a wafer using a pellicle in accordance with example embodiments. FIG. 10 is a cross-sectional view illustrating an exposure process for a formation of a pattern using a pellicle in accordance with example embodiments.

Referring to FIG. 9, an exposure apparatus 200 may include a light source 210, a relay lens 220, a blind 230, a photomask structure 260, a projection lens 270, and a wafer stage 280. A wafer W may be placed on the wafer stage 280. The photomask structure 260 may include a photomask 240 and a pellicle 250 manufactured according to example embodiments. As mentioned above, the photomask 240 may be protected from particles and contaminants by the pellicle 250.

Light L generated by and emitted from the light source 210 may be irradiated toward the relay lens 220. The light through the relay lens 220 may be irradiated toward the blind 230. The light may selectively penetrate through blind 230, and may be irradiated sequentially toward the photomask structure 260 and the projection lens 270. The light through the photomask structure 260 may include an optical pattern information. The light through the projection lens 270 may be focused on the wafer W placed on the wafer stage 280.

Referring to FIG. 10, the light generated by the exposure apparatus 200 may be irradiated toward a photoresist layer 295 formed on the wafer W. Accordingly, the photoresist layer 295 may be selectively exposed to the light based on the optical pattern information of the photomask 240. A photoresist pattern may be formed from a chemical difference between an exposed portion and a non-exposed portion. A layer 290 may be partially etched using the photoresist pattern to form a pattern on the wafer W.

By way of summation and review, the pellicle membrane may be formed as a nano-scaled thin layer due to optical properties thereof. However, the pellicle membrane may be physically and/or chemically damaged or transformed during formation of the pellicle, e.g., during transferring the membrane, attaching the membrane to a frame, or recovering the membrane from an etchant solution.

In contrast, example embodiments provide a pellicle having improved mechanical properties, and a method of manufacturing the same. That is, according to example embodiments, a membrane may be formed using a substrate as a catalyst, and the substrate may be partially removed in an etchant solution to form a frame supporting the membrane. The etchant solution may be replaced with a solvent, and the solvent may be removed to obtain a pellicle. Processes for manufacturing the pellicle may be performed in a liquid environment, e.g., the etchant solution or the solvent, so that the membrane may be prevented from being damaged.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a pellicle, the method comprising:
   forming a membrane on a first surface of a substrate from a chemical reaction in which the substrate serves as a catalyst;
   forming a protective pattern on a second surface of the substrate;
   immersing the substrate in an etchant solution in a container, such that a portion of the substrate exposed through the protective pattern is removed to form a frame;

replacing the etchant solution with a first solvent including water in the same container; and replacing the first solvent with a second solvent including alcohol to remove the protective pattern in the same container.

2. The method as claimed in claim 1, wherein the substrate is formed of at least one of iron (Fe), nickel (Ni), cobalt (Co), copper (Cu), and silicon (Si).

3. The method as claimed in claim 1, wherein the membrane is formed of at least one of graphite, carbon nano tube (CNT), and graphene.

4. The method as claimed in claim 1, wherein replacing the first solvent with the second solvent is performed using a dropping pipette.

5. The method as claimed in claim 1, wherein removing the second solvent is performed by evaporation.

6. The method as claimed in claim 1, wherein:

the protective pattern is formed on a peripheral portion of the substrate, and the frame supports a peripheral portion of the membrane.

7. The method as claimed in claim 1, wherein the etchant solution has a relatively high etching rate with respect to the substrate, and has a relatively low etching rate with respect to the protective pattern and the membrane.

8. The method as claimed in claim 1, wherein the protective pattern is formed of a photoresist material, a polymer material, or an adhesive material.

\* \* \* \* \*